(12) United States Patent
Okano et al.

(10) Patent No.: US 7,257,793 B2
(45) Date of Patent: Aug. 14, 2007

(54) INFORMATION DISPLAY SYSTEM AND INFORMATION DISPLAY METHOD

(75) Inventors: Motochika Okano, Ome (JP); Kazushi Ikeda, Hino (JP); Kazuyuki Matsuda, Ome (JP)

(73) Assignee: Kabushiki Kaisha Toshiba, Tokyo (JP)

(*) Notice: Subject to any disclaimer, the term of this patent is extended or adjusted under 35 U.S.C. 154(b) by 270 days.

(21) Appl. No.: 10/948,549

(22) Filed: Sep. 24, 2004

(65) Prior Publication Data
US 2005/0091626 A1 Apr. 28, 2005

(30) Foreign Application Priority Data
Sep. 30, 2003 (JP) ............... 2003-342324

(51) Int. Cl.
G06F 17/50 (2006.01)
G06F 9/455 (2006.01)
(52) U.S. Cl. .................................. 716/11
(58) Field of Classification Search ............ 716/1, 716/3, 5, 11
See application file for complete search history.

(56) References Cited

U.S. PATENT DOCUMENTS

| | | | | |
|---|---|---|---|---|
| 6,009,252 | A * | 12/1999 | Lipton | 716/5 |
| 6,240,541 | B1 * | 5/2001 | Yasuda et al. | 716/6 |
| 6,470,482 | B1 * | 10/2002 | Rostoker et al. | 716/6 |
| 6,938,231 | B2 * | 8/2005 | Yoshida et al. | 716/5 |
| 2002/0046387 | A1 * | 4/2002 | Matsushita et al. | 716/1 |
| 2002/0067364 | A1 * | 6/2002 | Lane et al. | 345/531 |
| 2003/0128238 | A1 * | 7/2003 | Kurosaki et al. | 345/751 |
| 2004/0128638 | A1 * | 7/2004 | Kerzman et al. | 716/11 |

FOREIGN PATENT DOCUMENTS

CN 1260665 A 7/2000
JP 7-262241 10/1995

OTHER PUBLICATIONS

Zhu Xiaojuan, Contrast and Complementation Between Protel and AutoCAD in Circuit Aided Design, China Academic Journal Electronic Publishing House, No. 4, Dec. 2002, pp. 70-74.
Notification of the First Office Action issued by the Patent Office of the People's Republic of China, dated Mar. 9, 2007, in Chinese Application No. 200410047196.6 and English translation of Notification.

* cited by examiner

*Primary Examiner*—Paul Dinh
*Assistant Examiner*—Suresh Memula
(74) *Attorney, Agent, or Firm*—Finnegan, Henderson, Farabow, Garrett & Dunner, L.L.P.

(57) ABSTRACT

An information display method includes converting circuit diagram CAD data of a circuit board into a first standard format and converting layout diagram CAD data of the circuit board into a second standard format, displaying a circuit diagram based on the circuit diagram CAD data converted into the first standard format on a screen of a circuit-diagram viewer and displaying a layout diagram based on the layout diagram CAD data converted into the second standard format on a screen of a layout-diagram viewer, highlighting a circuit element selected on the screen of either the circuit-diagram viewer or the layout-diagram viewer using specified color, and giving information for identifying the circuit element selected on the screen to another viewer, and highlighting an element corresponding to the circuit element identified by the given information on the screen of the viewer receiving the information using specified color.

9 Claims, 10 Drawing Sheets

Read several circuit diagrams

Board data (containing several layout diagrams)

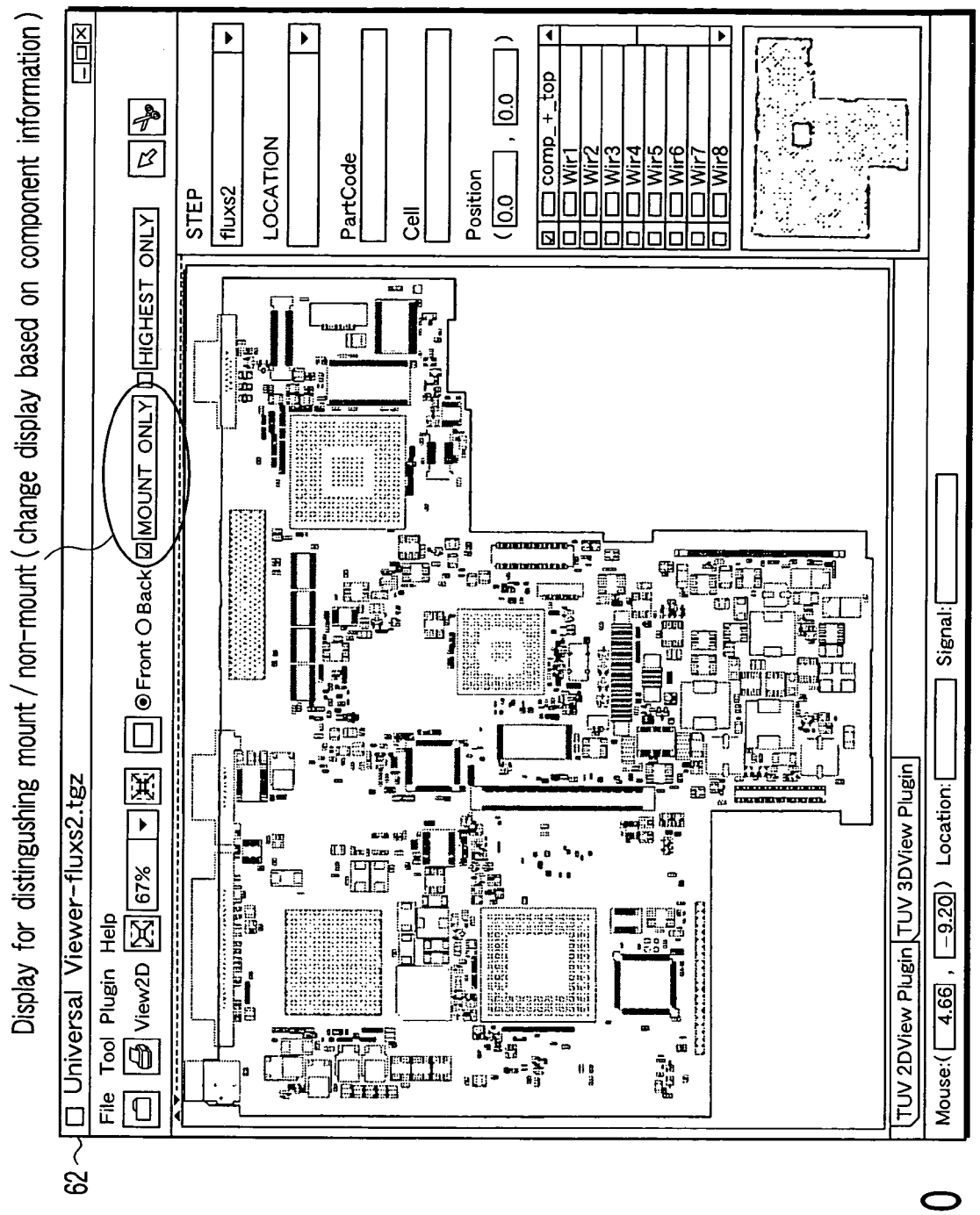
F I G. 10

When component or signal line of circuit disgram is selected, corresponding 3D layout diagram is highlighted.
In 3D layout, only highlight display is automatically made.

US 7,257,793 B2

INFORMATION DISPLAY SYSTEM AND INFORMATION DISPLAY METHOD

CROSS-REFERENCE TO RELATED APPLICATIONS

This application is based upon and claims the benefit of priority from prior Japanese Patent Application No. 2003-342324, filed Sep. 30, 2003, the entire contents of which are incorporated herein by reference.

BACKGROUND OF THE INVENTION

1. Field of the Invention

The present invention relates to information display system and method, which are capable of displaying circuit information and/or mount information based on PCB-CAD data.

2. Description of the Related Art

Software for browsing the content of data file is called as a viewer, and various type viewers are given. For example, one of the viewers is a circuit-diagram viewer for browsing circuit diagrams based on computer aided design (CAD) data of a printed circuit board (PCB). Another is a layout-diagram viewer for browsing the layout diagram of a circuit board. The foregoing circuit and layout-diagram viewers are provided and are used independently from each other.

JPN. PAT. APPLN. KOKAI Publication No. 7-262241 (e.g., FIG. 6) discloses the technique of displaying the mutual relationship between components and board when making a mount design of a printed circuit board.

However, the conventional technique described above has the following problem. More specifically, the circuit-diagram viewer and the layout-diagram viewer exist independently from each other. For this reason, it is difficult to grasp the corresponding relationship of components and wirings (including signal lines, power source/ground plane) in the foregoing circuit-diagram and layout-diagram viewers. For example, the ground plane on the circuit diagram is shown by symbol only; as a result, it is difficult to grasp where the ground plane is mapped on the layout diagram.

In addition, the foregoing Publication discloses the technique of simultaneously displaying several kinds of diagrams on one screen. This is the technique used under the environment for making a design, and thus, not suitable for browsing the diagrams. In other words, the technique disclosed in the foregoing Publication is not adaptable to circuit-diagram and layout-diagram viewers existing independently from each other.

From the reason described above, it is desired to propose the technique of readily grasping the corresponding relationship of components in different kinds of viewers.

BRIEF SUMMARY OF THE INVENTION

According to one aspect of the present invention, there is provided an information display method, comprising converting circuit diagram CAD data of a circuit board into a first standard format and converting layout diagram CAD data of the circuit board into a second standard format; displaying a circuit diagram based on the circuit diagram CAD data converted into the first standard format on a screen of a circuit-diagram viewer and displaying a layout diagram based on the layout diagram CAD data converted into the second standard format on a screen of a layout-diagram viewer; highlighting a circuit element selected on the screen of either the circuit-diagram viewer or the layout-diagram viewer using specified color, and giving information for identifying the circuit element selected on the screen to another viewer; and highlighting an element corresponding to the circuit element identified by the given information on the screen of the viewer receiving the information using specified color.

According to another aspect of the present invention, there is provided an information display system, comprising a first processing section displaying a circuit diagram based on circuit diagram CAD data of a circuit board on a screen of a circuit-diagram viewer; a second processing section displaying a circuit diagram based on layout diagram CAD data of the circuit board on a screen of a layout-diagram viewer; and a processing section highlighting a circuit element selected on the screen of either the circuit-diagram viewer or the layout-diagram viewer using specified color, and giving information for identifying the circuit element selected on the screen to another viewer, and further, highlighting an element corresponding to the circuit element identified by the given information on the screen of the viewer receiving the information using specified color when receiving the given information from another viewer.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 10 is a view showing a display state for distinguishing mount/non-mount of individual components using specified color on a screen of the layout-diagram viewer;

DETAILED DESCRIPTION OF THE INVENTION

Embodiments of the present invention will be described below with reference to the drawings.

Figure 1:
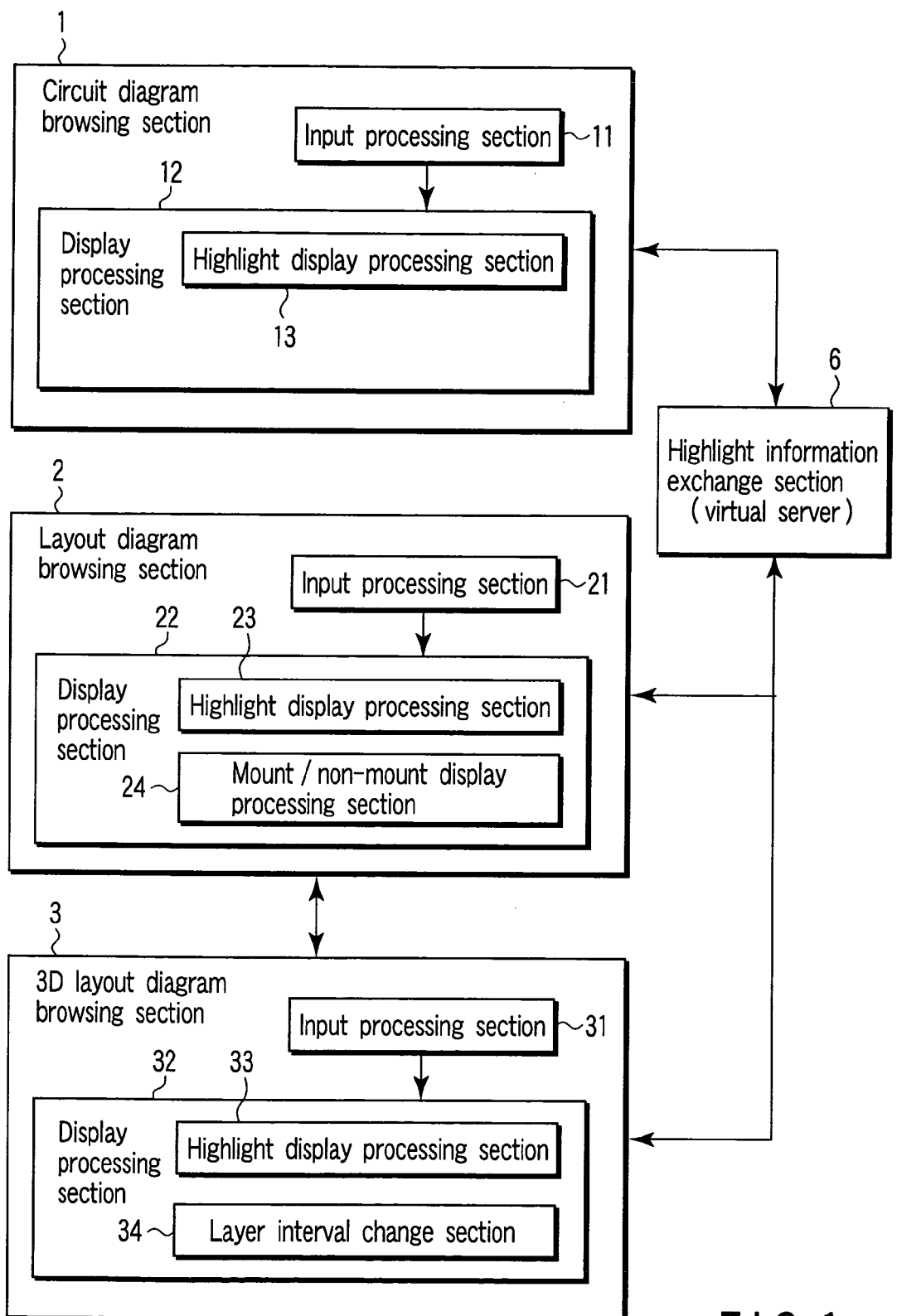
FIG. 1 is a block diagram showing the functional configuration of a browser system according to one embodiment of the present invention.

FIG. 1 is a block diagram showing the functional configuration of an information display system according to one embodiment of the present invention. The information display system of the present invention has a function as a browser system. Thus, the information display system calls the browser system in the following description. The browser system may comprise several computers (including server on network) connected via network or a single computer (including virtual sever). The present embodiment shows the case where the browser system comprises a single computer.

The browser system includes circuit diagram browsing section 1, layout diagram browsing section 2, 3D layout diagram browsing section 3 and highlight information exchange section (virtual server) 6 at least.

The circuit diagram browsing section 1 is equivalent to a circuit-diagram viewer function for browsing circuit diagrams, and includes input processing section 11 and display processing section 12. The input processing section 11 deals with instructions inputted to a circuit-diagram viewer via keyboard and mouse. The display processing section 12 displays circuit diagrams based on circuit diagram CAD data of a PCB on a screen of the circuit-diagram viewer, and makes various display processing. In this case, the display processing section 12 displays the circuit diagram CAD data in accordance with the instructions inputted by the input processing section 11. Incidentally, the circuit diagram CAD data format is an international standard format (EDIF format).

The display processing section 12 is provided with a highlight display processing section 13. The highlight display processing section 13 highlights circuit elements selected by user on the screen of the circuit-diagram viewer using specified color. For example, the circuit elements are component or wiring (including signal line, power source/ground plan). The highlight display processing section 13 makes highlight display using lighting or flashing on-and-off as the display in order to distinguish these circuit elements from other circuit elements on the screen. Further, the highlight display processing section 13 has a function of giving highlight information including identification number (component number) for distinguishing selected component or wiring to another viewer. When receiving the highlight information including the identification number from another viewer, the highlight display processing section 13 makes the display given below. The highlight display processing section 13 lights or flashes on and off, that is, highlights elements corresponding to component or wiring identified by the identification number the highlight information thus notified on the screen of the circuit-diagram viewer.

The layout diagram browsing section 2 is equivalent to a layout-diagram viewer function (two-dimensional display) for browsing layout diagrams, and includes input processing section 21 and display processing section 22. The input processing section 21 deals with instructions inputted to a layout-diagram viewer (two-dimensional display) via keyboard and mouse. The display processing section 22 displays two-dimensional layout diagrams based on layout diagram CAD data of the printed circuit board on a screen of the layout-diagram viewer, and makes various display processing. In this case, the display processing section 22 displays the layout diagram CAD data in accordance with the instructions inputted by the input processing section 21. Incidentally, the layout diagram CAD data format is an international standard format (ODB++ format).

The display processing section 22 is provided with a highlight display processing section 23. The highlight display processing section 23 highlights circuit elements corresponding to component or wiring selected by user on the screen of the layout-diagram viewer (two-dimensional display). In this case, the highlight display processing section 23 lights or flashes on and off, that is, highlights these circuit elements using specified color in order to distinguish these circuit elements from other circuit elements on the screen. Further, the highlight display processing section 23 has a function of giving highlight information including identification number for distinguishing selected component or wiring to another viewer. When receiving the highlight information including the identification number from another viewer, the highlight display processing section 23 makes the display given below. The highlight display processing section 23 lights or flashes on and off, that is, highlights elements corresponding to component or wiring identified by the identification number included in the highlight information thus notified on the screen of the layout-diagram viewer (two-dimensional display).

The display processing section 22 is further provided with a mount/non-mount display processing section 24. The mount/non-mount display processing section 24 has a function of making a display for distinguishing mount/non-mount of individual components using specified color in the layout diagram.

The 3D layout diagram browsing section 3 is equivalent to a layout-diagram viewer (three-dimensional display) for browsing three-dimensional layout diagrams, includes input processing section 31 and display processing sections 32. The input processing section 31 deals with instructions inputted to a layout-diagram viewer (three-dimensional display) via keyboard and mouse. The display processing section 32 displays three-dimensional layout diagrams based on layout diagram CAD data of the printed circuit board on the screen of the layout-diagram viewer, and makes various display processing. In this case, the display processing section 32 displays the layout diagram CAD data in accordance with the instructions inputted by the input processing section 31. Incidentally, the layout diagram CAD data format is an international standard format (ODB++ format).

The display processing section 32 is provided with a highlight display processing section 33. The highlight display processing section 33 highlights elements corresponding to component or wiring selected by user on the screen of the layout-diagram viewer (three-dimensional display). In this case, the highlight display processing section 23 lights or flashes on and off, that is, highlights these elements using specified color in order to distinguish these elements on the screen. Further, the highlight display processing section 33 has a function of giving highlight information including identification number for distinguishing selected component or wiring to another viewer. When receiving the highlight information including the identification number from another viewer, the highlight display processing section 33 makes the display given below. The highlight display processing section 33 lights or flashes on and off, that is, highlights elements corresponding to component or wiring identified by the identification number included in the highlight information thus notified on the screen of the layout-diagram viewer (three-dimensional display).

The display processing section 32 is further provided with a layer interval change section 34. The layer interval change section 34 has a function of changing the interval between individual layers forming a circuit board displayed in a three-dimensional layout diagram.

The highlight information exchange section (virtual server) 6 has the following function. That is, when receiving highlight information including identification number for distinguishing component or wiring selected on any screen of the foregoing viewers, the highlight information exchange section 6 makes an exchange of the notice to another viewer.

Figure 2:
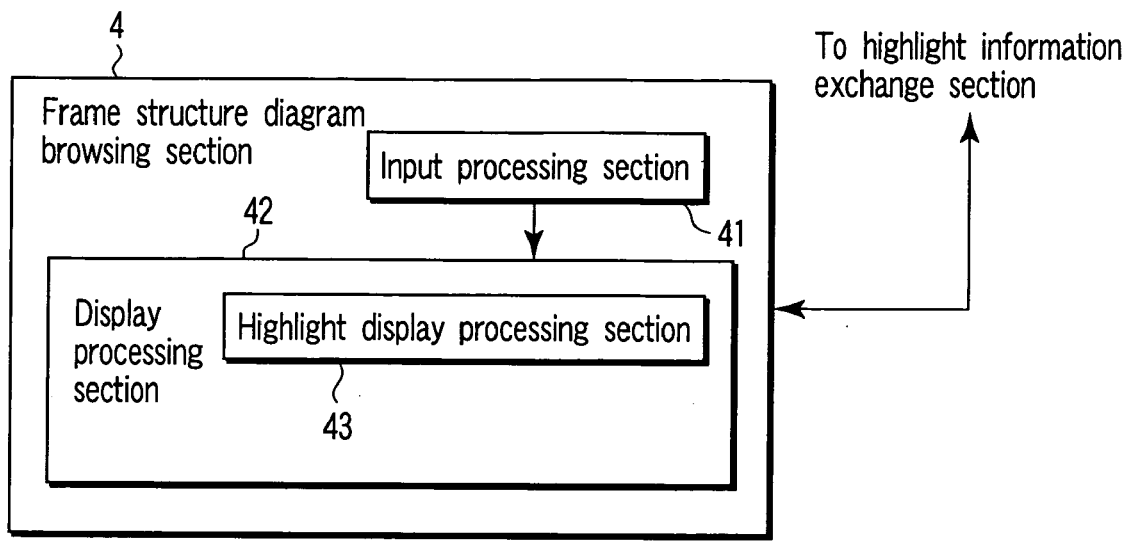
FIG. 2 is a block diagram showing the configuration of a frame structure diagram browsing section added to the browser system.

The foregoing browser system may be additionally provided with a frame structure diagram browsing section 4 shown in FIG. 2. The frame structure diagram browsing section 4 is equivalent to a frame structure diagram viewer function for browsing frame structure diagrams, and includes input processing section 41 and display processing section 42. The input processing section 41 deals with instructions inputted to a box structure diagram viewer via keyboard and mouse. The display processing section 42 displays three-dimensional frame structure diagrams based on layout diagram CAD data of the printed circuit board on the screen of the frame structure diagram viewer, and makes various display processing. In this case, the display processing section 42 displays the box structure diagram CAD data in accordance with the instructions inputted by the input processing section 41. Incidentally, the box structure diagram CAD data format is an international standard format.

The display processing section 42 is provided with a highlight display processing section 43. The highlight display processing section 43 lights or flashes on and off, that is, highlights a frame portion selected by user on the screen of the frame structure diagram viewer using specified color in order to distinguish the frame portion from other frame portions on the screen. Further, the highlight display processing section 43 has a function of giving highlight information including identification number for identifying component or wiring relevant to the frame portion selected on the screen to another viewer. When receiving the highlight information including the identification number from another viewer, the highlight display processing section 43 makes the display given below. The highlight display processing section 43 lights or flashes on and off, that is, highlights the frame portion relevant to component or wiring identified by the identification number included in the highlight information thus notified on the screen of the frame structure diagram viewer using specified color.

Figure 3:
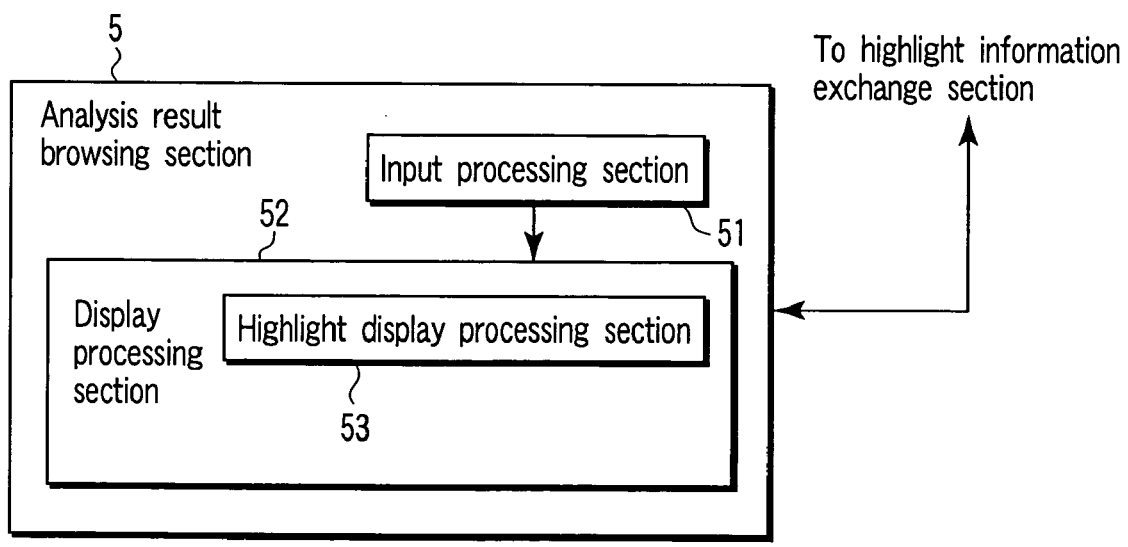
FIG. 3 is a block diagram showing the configuration of an analysis result browsing section added to the browser system.

The foregoing browser system may be additionally provided with an analysis result browsing section 5 shown in FIG. 3. The analysis result browsing section 5 is equivalent to an analysis result viewer function for browsing the analysis result, and includes input processing section 51 and display processing section 52. The input processing section 51 deals with instructions inputted to an analysis result viewer via keyboard and mouse. The display processing section 52 displays analysis result data relevant to the printed circuit board on the screen of the analysis result viewer in accordance with the instructions inputted by the input processing section 51, and makes various display processing. In this case, the analysis result data includes data resulted from various analysis such as thermal analysis, strength analysis, EMI analysis, power source/ground plane analysis, high-speed signal analysis and resin fluid analysis. Incidentally, the analysis result data format is an international standard format.

The display processing section 52 is provided with a highlight display processing section 53. The highlight display processing section 53 lights or flashes on and off, that is, highlights a analysis result selected by user on the screen of the analysis result viewer using specified color in order to distinguish the analysis result from other analysis results on the screen. Further, the highlight display processing section 53 has a function of giving highlight information including identification number for identifying component or wiring relevant to the analysis result selected on the screen to another viewer. When receiving the highlight information including the identification number from another viewer, the highlight display processing section 53 makes the display given below. The highlight display processing section 53 lights or flashes on and off, that is, highlights the analysis result relevant to component or wiring identified by the identification number included in the highlight information thus notified on the screen of the analysis result viewer using specified color.

Figure 4:
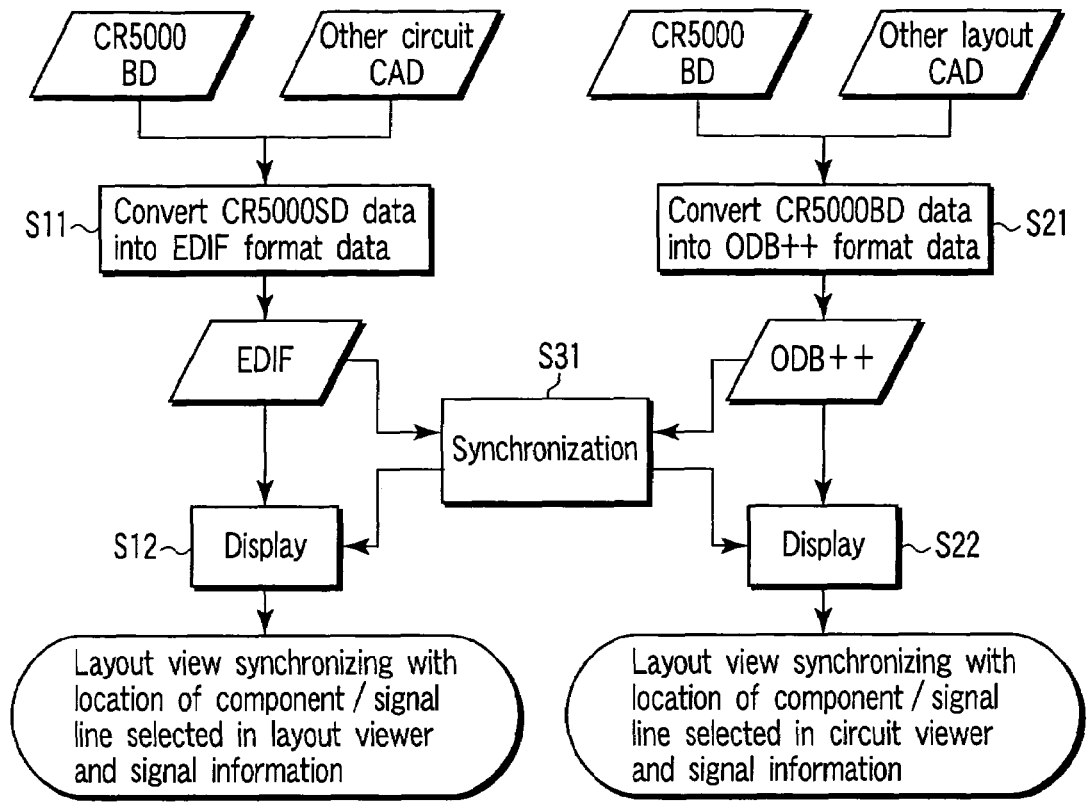
FIG. 4 is a flowchart to explain the procedure for realizing a browse control in the browsing system.

The procedure for realizing a browse control in the browser system will be described below with reference to FIG. 4. For simplification of explanation, the case where only circuit and layout-diagram viewers are used as the viewer is given below.

For example, "CR5000SD data" is known as circuit diagram CAD data of a printed circuit board. The "CR5000SD data" is converted into an "EDIF format" known as the De Fact (industrial) Standard format (step S11). On the other hand, "CR5000BD data" is known as layout diagram CAD data of a printed circuit board. The "CR5000BD data" is converted into an "ODB++ format" known as the De Fact (industrial) Standard format (step S21).

Thereafter, the circuit-diagram viewer boots to display circuit diagrams based on the circuit diagram CAD data converted into an EDIF format on a screen of the circuit-diagram viewer. The layout-diagram viewer boots to display layout diagrams based on the layout diagram CAD data converted into an ODB++ format on a screen of the layout-diagram viewer.

After booted, these circuit and layout-diagram viewers are synchronized with each other (step S31). More specifically, if highlighted component or wiring exists on the screen of the circuit-diagram viewer, the corresponding component or wiring is highlighted on the screen of the layout-diagram viewer. Likewise, if highlighted component or wiring exists on the screen of the layout-diagram viewer, the corresponding component or wiring is highlighted on the screen of the circuit-diagram viewer.

For example, if the user selects component or wiring on the screen of the layout-diagram viewer, the corresponding component or wiring is highlighted on the screen thereof. In addition, according to the foregoing synchronization, the corresponding component or wiring are highlighted on the screen of the circuit-diagram viewer (step S12).

On the other hand, if the user selects component or wiring on the screen of the circuit-diagram viewer, the corresponding component or wiring is highlighted on the screen thereof. In addition, according to the foregoing synchronization, the corresponding component or wiring are highlighted on the screen of the layout-diagram viewer (step S22).

As described above, CAD data used in each viewer is converted into the De Facto format, and thereafter, synchronized, thereby making an exchange between various types of CAD data. In addition, an exchange between two- and three-dimensional CAD data is readily made.

Figure 5:
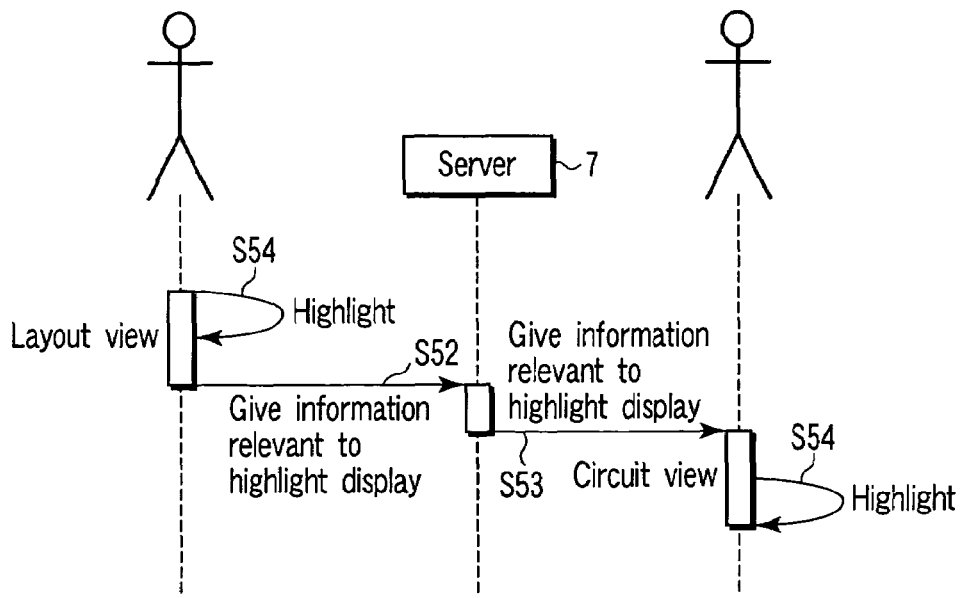
FIG. 5 is a view to explain the operation of making synchronization via server on network.

The operation of making synchronization via server on network will be explained below with reference to FIG. 5.

A server 7 is connected to individual client computers in which various viewers (i.e., circuit and layout-diagram viewers) are operating, via network.

For example, the user of a computer selects component or wiring on the screen of the layout-diagram viewer. In this case, the highlight display processing section 23 highlights the corresponding component or wiring on the screen of the layout-diagram viewer in response to the user's selection (step S51). Then, the highlight display processing section 23 gives highlight information including identification number for identifying the component or wiring to the server 7 (step S52).

When receiving the highlight information from the computer in which the layout viewer is operating, the server 7 gives the highlight information to all viewers excepting the layout-diagram viewer (i.e., circuit-diagram viewer) (step S53).

When receiving the given highlight information from the sever 7, the computer in which the circuit-diagram viewer is operating highlights the component or wiring identified by identification number included in the given highlight information on the screen of the circuit-diagram viewer (step S54).

As described above, circuit and layout-diagram viewers (including two- and three-dimensional layout diagrams) are synchronized via the network. By doing so, individual users make contact relative to highlight information while using different viewer (specialized viewer). Of course, the frame structure diagram viewer and the analysis result viewer are synchronized likewise.

Figure 6:
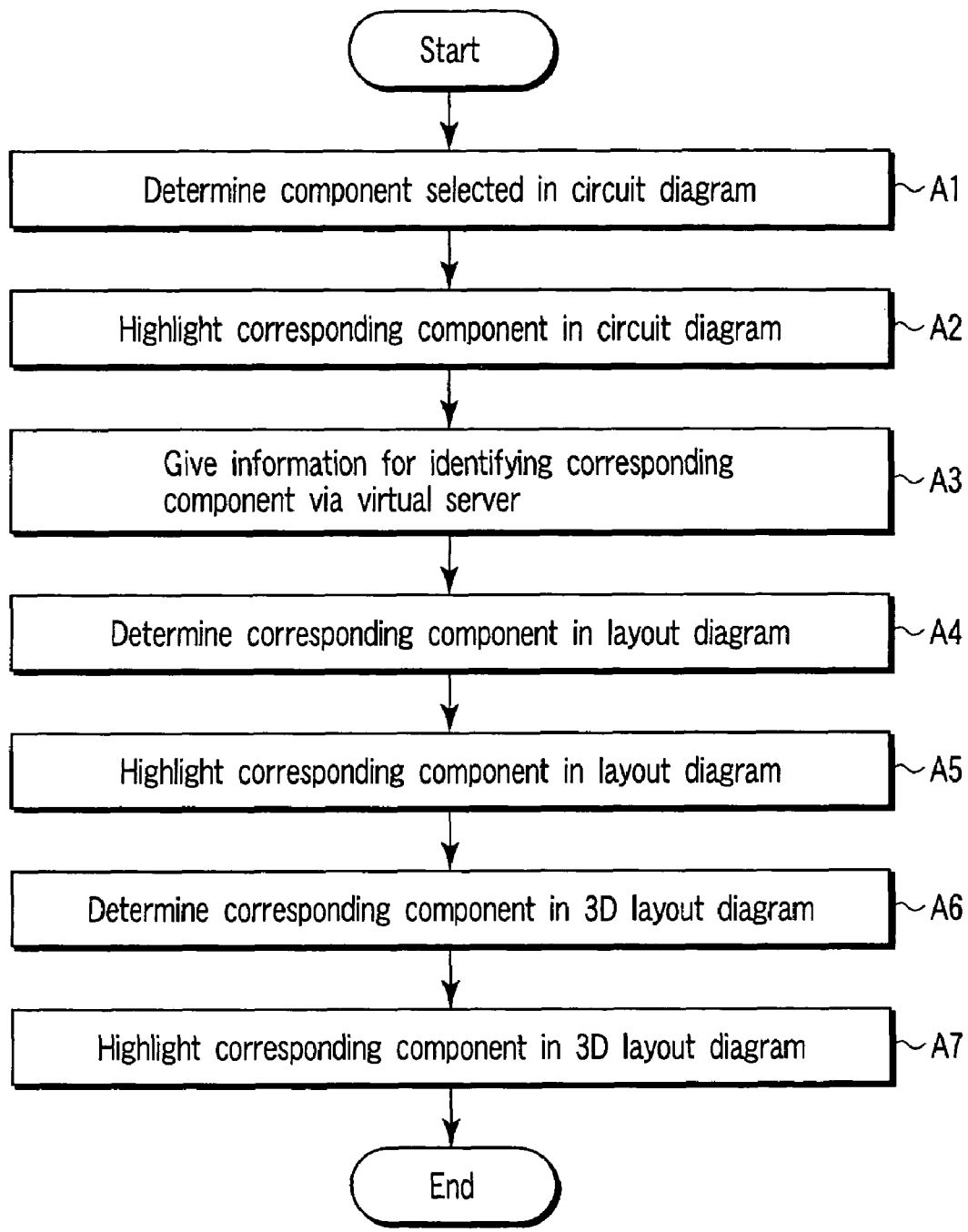
FIG. 6 is a flowchart to explain the flow of the synchronous operation in the configuration shown in FIG. 1.

The flow of the synchronization in the configuration shown in FIG. 1 will be explained below with reference to FIG. 6.

For example, the user selects a component or wiring on the screen of the circuit-diagram viewer.

In this case, the input processing section 11 transfers information showing the selected component or wiring to the display processing section 12 in the circuit diagram browsing section 1 realizing the circuit-diagram viewer. The highlight display processing section 13 determines the selected component or wiring in the circuit diagram based on the information transferred from the input processing section 11 (step A1). Thereafter, the highlight display processing section 13 highlights the corresponding component or wiring in the circuit diagram (step A2).

The highlight display processing section 13 further gives the highlight information including identification number for identifying the component or wiring to the highlight information exchange section (virtual server) 6 (step A3). Then, the highlight information exchange section 6 gives the given highlight information to all viewers excepting the circuit-diagram viewer (step A3). In this case, all viewers are the layout diagram browsing section 2 for browsing a two-dimensional layout diagram, and the 3D layout diagram browsing section 3 for browsing a three-dimensional layout diagram. Incidentally, when giving the highlight information, it may be transferred to the 3D layout diagram browsing section 3 via the layout diagram browsing section 2.

The highlight display processing section 23 of the layout diagram browsing section 2 determines the corresponding component or wiring in the two-dimensional layout diagram based on the following information (step A4). The information is the identification number included in the highlight information transferred from the highlight information exchange section 6. Thereafter, the highlight display processing section 23 highlights the corresponding component or wiring in the two-dimensional layout diagram (step A5).

Likewise, the highlight display processing section 33 of the 3D layout diagram browsing section 3 determines the corresponding component or wiring in the three-dimensional layout diagram based on the following information (step A6). The information is the identification number included in the highlight information transferred from the highlight information exchange section 6 or layout diagram browsing section 2. Thereafter, the highlight display processing section 33 highlights the corresponding component or wiring in the two-dimensional layout diagram (step A7).

Figure 7:
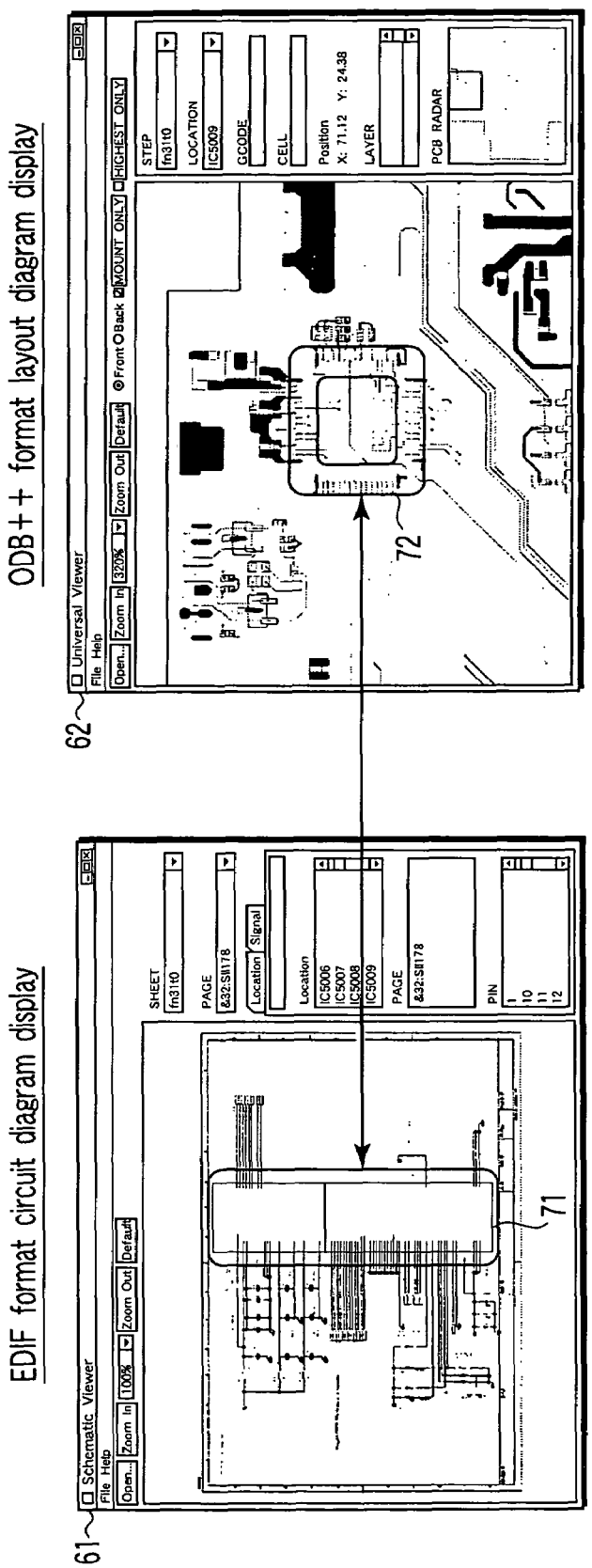
FIG. 7 is a view showing a state that highlight display is made in synchronous with circuit-diagram and layout-diagram viewers.

FIG. 7 is a view showing a state that highlight display is made in synchronous with circuit- and layout-diagram viewers.

A circuit-diagram viewer 61 displays a circuit diagram based on EDIF format circuit diagram CAD. On the other hand, a layout-diagram viewer 62 displays a two-dimensional layout diagram based on ODB++ format layout diagram CAD data. For example, a user selects a component in the circuit diagram, and an area 71 corresponding the selected component is highlighted. In this case, an area 72 equivalent to the corresponding component in the layout diagram is also highlighted. As described above, when the user selects the component or wiring, the corresponding area is highlighted in both circuit and layout diagrams. Therefore, it is possible to improve retrieval speed and information transmission.

Figure 8:
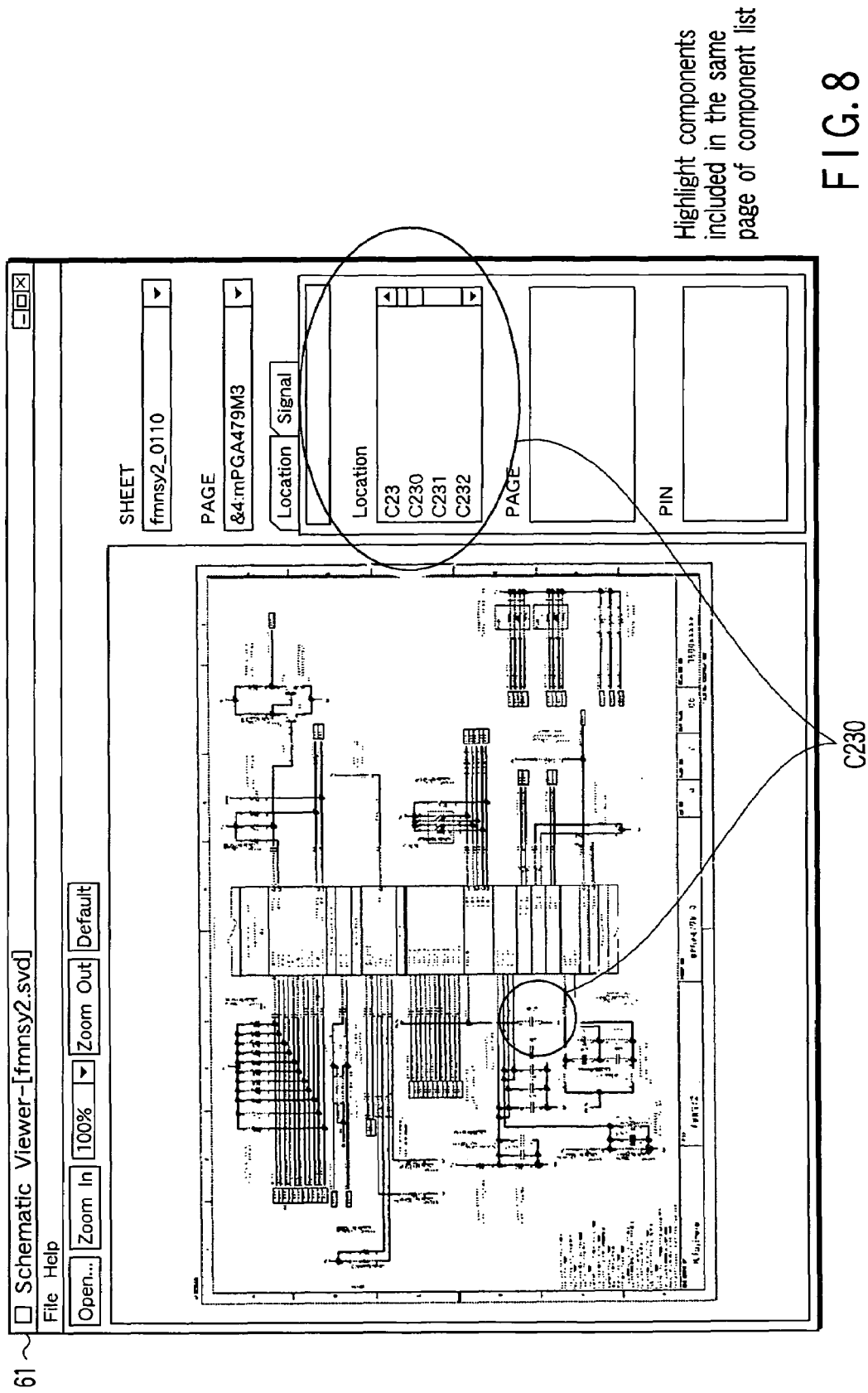
FIG. 8 is a view showing a state that highlight display is made in synchronous with a circuit diagram and a component list, which are simultaneously displayed on a screen of the circuit-diagram viewer.

FIG. 8 is a view showing a state that highlight display is made in synchronous with a circuit diagram and a component list, which are simultaneously displayed on a screen of the circuit-diagram viewer.

The circuit-diagram viewer 61 displays a component list (numbers of components included in the circuit diagram) in addition to the circuit diagram. For example, according to user click operation, the symbol of a component C230 of the circuit diagram is selected by, or the character string of the component C230 is selected from the component list. In this case, the symbol of the component C230 of the circuit diagram existing in the currently opening page and the character string of the component C230 of the component list are synchronously highlighted.

Figure 9:
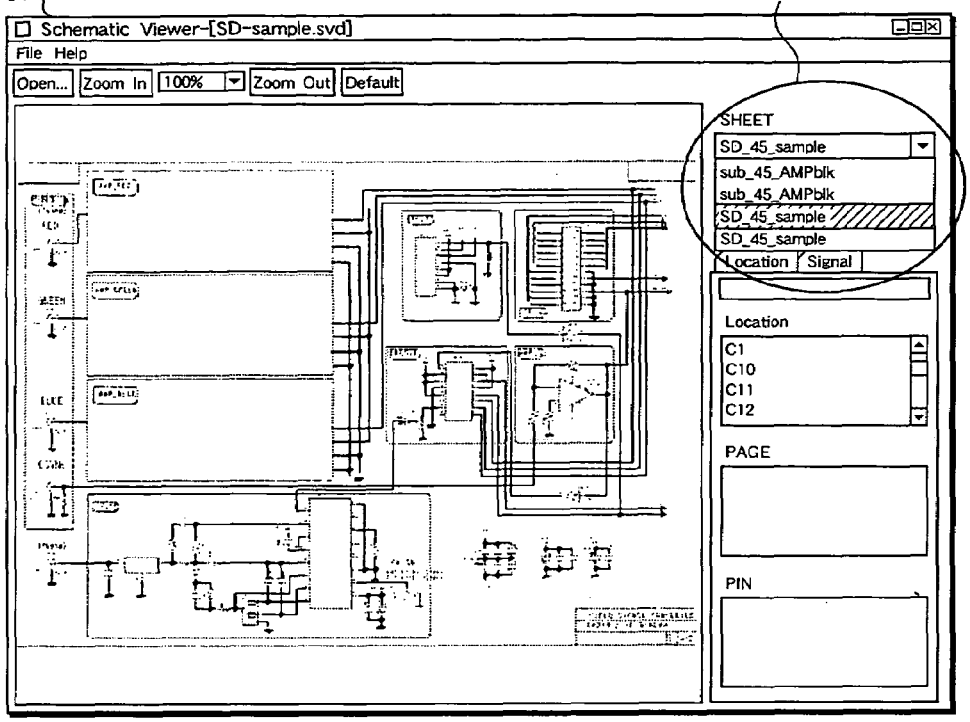
FIG. 9 is a view showing a state that several circuit diagrams are read on the screen of the circuit-diagram viewer, and thereafter, highlight display is made in synchronous with these circuit diagrams and board data containing several layout diagrams.
Figure 9:
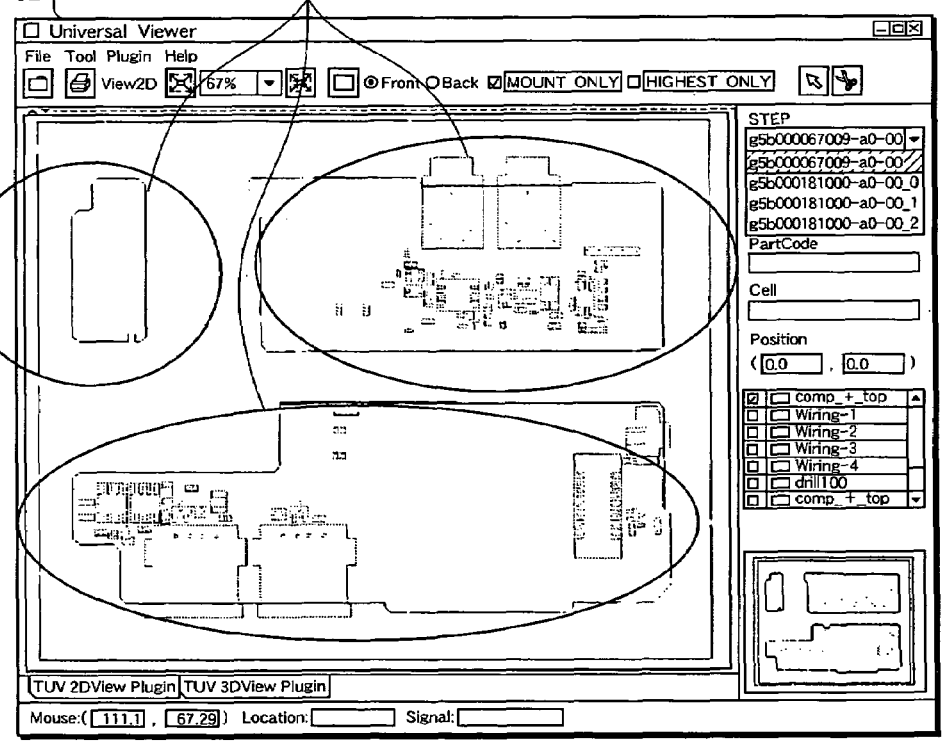

FIG. 9 is a view showing a state that several circuit diagrams are read on the screen of the circuit-diagram viewer, and thereafter, highlight display is made in synchronous with these circuit diagrams and board data containing several layout diagrams.

Several circuit diagrams are selected from a circuit diagram list on the screen of the circuit-diagram viewer 61, and thereafter, these circuit diagrams are read on the screen. In synchronous with the foregoing display, several layout diagrams corresponding to the foregoing several circuit diagrams are read on the screen of the layout-diagram viewer 62. In also case, circuit diagrams displayed by the circuit-diagram viewer 61 and layout diagrams displayed by the layout-diagram viewer 62 are synchronously highlighted.

FIG. 10 is a view showing a display state for distinguishing mount/non-mount of individual components using specified color on a screen of the layout-diagram viewer.

A select item for determining whether or not a display for distinguishing mount/non-mount of individual components using specified color is given on the screen of the layout-diagram viewer 62. In the select item, if the user makes a setup "display mounted component only", the symbol of the mounted component id displayed in the layout diagram in a state of being distinguished from non-mount component using specified color.

Figure 11:
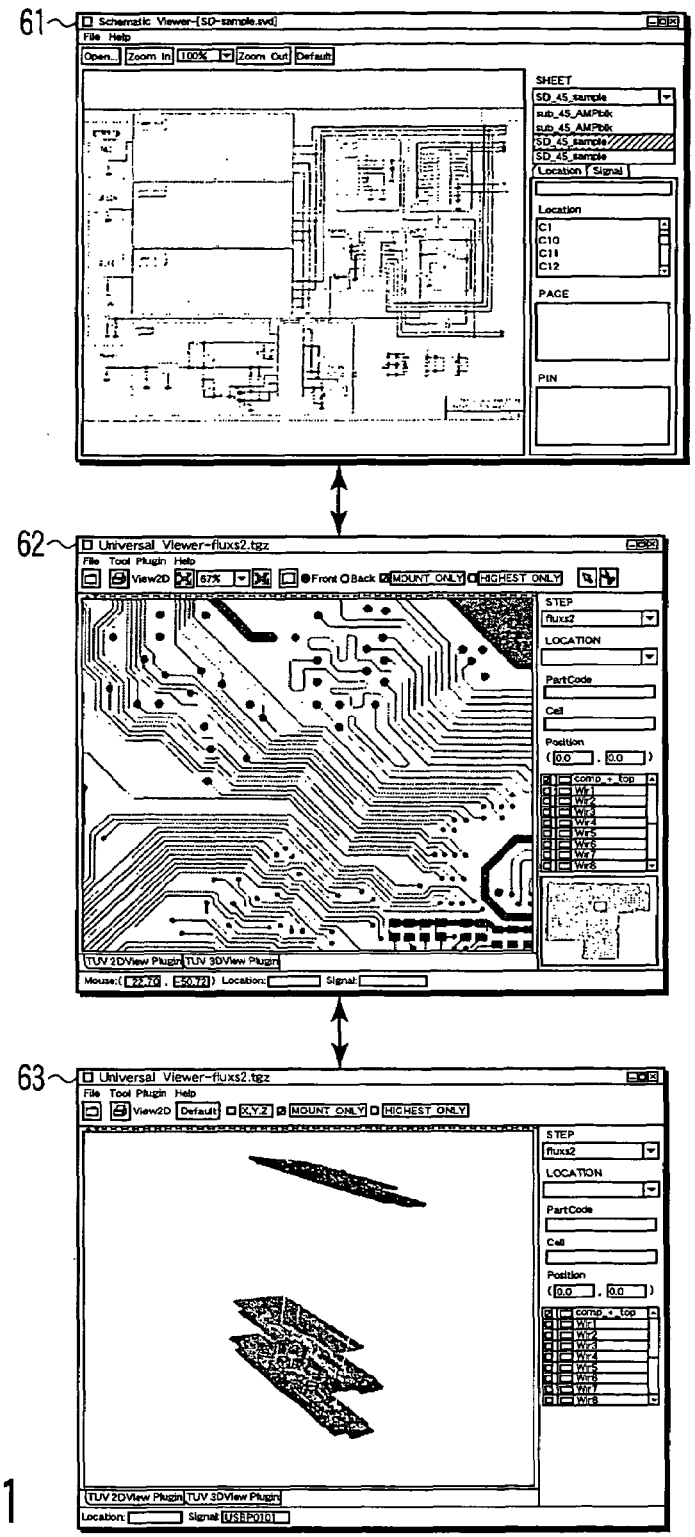
FIG. 11 is a view to explain a state that highlight display is made in synchronous with circuit-diagram viewer, layout-diagram viewer and 3D layout viewer.

FIG. 11 is a view to explain a state that highlight display is made in synchronous with circuit-diagram viewer, layout-diagram viewer and 3D layout viewer.

When a component or wiring of the circuit diagram is selected in the circuit-diagram viewer 61, the corresponding component or wiring of the layout diagram is highlighted in the layout-diagram viewer 62. Further, the corresponding component or wiring of a 3D layout diagram is highlighted in a 3D layout viewer 63. In this case, only highlighted portion is displayed in the 3D layout diagram. Even if the wiring selected in the circuit diagram is arranged having relation with some layers of the circuit board, the wiring is three-dimensionally displayed in the 3D layout diagram as seen from FIG. 11. Therefore, it is possible to visually readily grasp the foregoing-state wiring.

Figure 12:
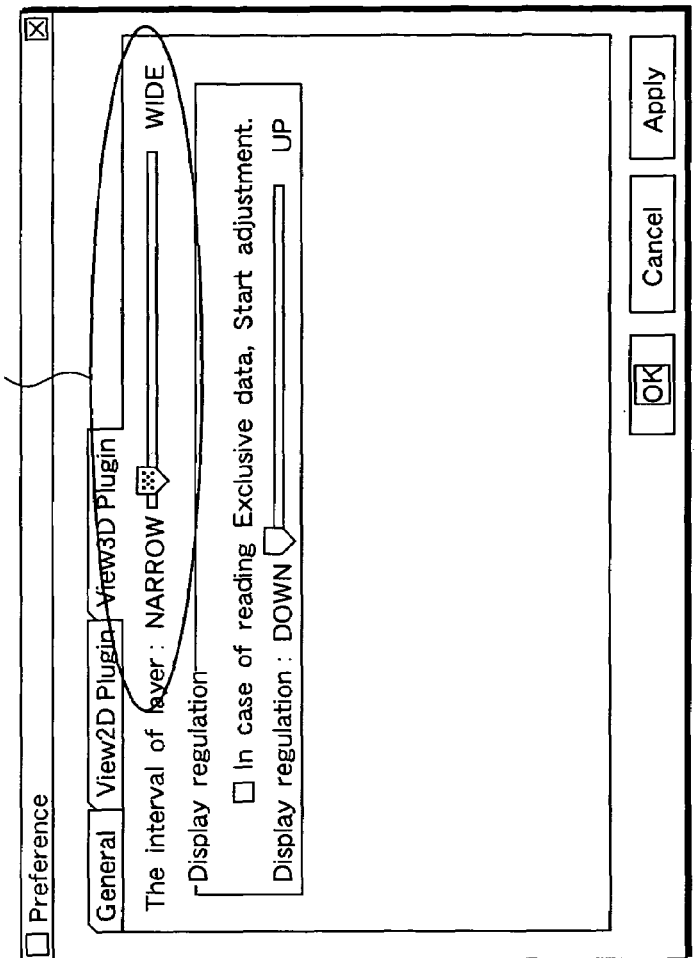
FIG. 12 is a view showing a state of changing the interval of layer between circuit boards displayed on a three-dimensional layout in the 3D layout viewer.

FIG. 12 is a view showing a state of changing the interval of layer between circuit boards displayed on a three-dimensional layout in the 3D layout viewer.

The 3D layout viewer 63 displays individual layers forming the circuit board displayed in the three-dimensional layout diagram. The 3D layout viewer 63 displays a reference screen 64 for changing the interval between layers so that the user can visually readily grasp component or wiring.

According to the present embodiment, it is possible to readily grasp the corresponding relationship of the component or wiring between different kinds of viewers. That is, the viewers are circuit-diagram viewer, layout-diagram viewer, 3D layout viewer, frame structure diagram viewer and analysis result viewer.

Therefore, according to the present invention, it is possible to readily grasp the corresponding relationship of the component between different kinds of viewers.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An information display system, comprising:
   a first processing section displaying a circuit diagram based on circuit diagram CAD data of a circuit board on a screen of a circuit-diagram viewer;
   a second processing section displaying a circuit diagram based on layout diagram CAD data of the circuit board on a screen of a layout-diagram viewer;
   a third processing section highlighting a circuit element selected on the screen of either the circuit-diagram viewer or the layout-diagram viewer using a specified color, and giving information for identifying the circuit element selected on the screen to another viewer, and further, highlighting an element corresponding to the circuit element identified by the given information on the screen of the viewer receiving the information using the specified color when receiving the given information from another viewer;
   a fourth processing section displaying a frame structure diagram based on frame structure diagram CAD data relevant to the circuit board on a screen of a frame structure diagram viewer; and
   a fifth processing section highlighting a frame portion selected on the screen of the frame structure diagram viewer using the specified color, and giving information for identifying a component or wiring relevant to the frame portion selected on the screen to another viewer, and further highlighting the frame portion relevant to a component or wiring identified by the given information on the screen of the frame structure diagram viewer using the specified color when receiving the information from another viewer.

2. The system according to claim 1, wherein the circuit element is an element equivalent to a component or wiring.

3. The system according to claim 1, wherein the highlighting is a lighting or flashing on and off.

4. The system according to claim 1, wherein the circuit diagram CAD data format is an EDIF format, and the layout diagram CAD data format is an ODB++ format.

5. The system according to claim 1, further comprising:
   a processing section simultaneously highlighting the selected circuit element in a circuit element list and an element corresponding to the selected circuit element in the circuit diagram on the screen of the circuit-diagram viewer.

6. The system according to claim 1, further comprising:
   a processing section making a display for distinguishing components mounted on the circuit board from components not mounted on the circuit board in the layout diagram.

7. The system according to claim 1, further comprising:
   a processing section displaying two-dimensional layout diagrams based on the layout diagram CAD data on the screen;
   a processing section displaying three-dimensional layout diagrams based on the layout diagram CAD data on the screen; and
   a processing section simultaneously highlighting the selected circuit element on each screen of the two- and three-dimensional layout diagrams using the specified color.

8. The method system according to claim 7, further comprising:
   a processing section changing a distance between layers forming a circuit board displayed in the three-dimensional layout diagram.

9. An information display system, comprising:
   a first processing section displaying a circuit diagram based on circuit diagram CAD data of a circuit board on a screen of a circuit-diagram viewer;
   a second processing section displaying a circuit diagram based on layout diagram CAD data of the circuit board on a screen of a layout-diagram viewer;
   a third processing section highlighting a circuit element selected on the screen of either the circuit-diagram viewer or the layout-diagram viewer using a specified color, and giving information for identifying the circuit element selected on the screen to another viewer, and further, highlighting an element corresponding to the circuit element identified by the given information on the screen of the viewer receiving the information using the specified color when receiving the given information from another viewer;
   a fourth processing section displaying analysis result data relevant to the circuit board on a screen of an analysis result viewer; and
   a fifth processing section highlighting an analysis result selected on the screen of the analysis result viewer using the specified color, and giving information for identifying a component or wiring relevant to the analysis result selected on the screen to another viewer, and further highlighting the analysis result relevant to a component or wiring identified by the given information on the screen of the analysis result viewer using the specified color when receiving the information from another viewer.

* * * * *